United States Patent [19]
Chevallier

[11] Patent Number: 5,859,674
[45] Date of Patent: Jan. 12, 1999

[54] TUNING CIRCUIT FOR A RECEIVER, PARTICULARLY A TELEVISION RECEIVER

[75] Inventor: Gilles Chevallier, Langrune, France

[73] Assignee: U. S. Philips Corporation, New York, N.Y.

[21] Appl. No.: 595,091

[22] Filed: Feb. 1, 1996

[30] Foreign Application Priority Data

Feb. 8, 1995 [FR] France ..................................... 9501448

[51] Int. Cl.$^6$ ....................................................... H04N 5/44
[52] U.S. Cl. ........................................... 348/731; 348/733
[58] Field of Search ...................... 334/65–84; 348/731, 348/733; 455/150.1; H04N 5/44

[56] References Cited

U.S. PATENT DOCUMENTS

| | | | |
|---|---|---|---|
| 4,926,137 | 5/1990 | Shogaki et al. | 330/252 |
| 5,034,706 | 7/1991 | Betti et al. | 311/117 R |
| 5,198,781 | 3/1993 | Kusakabe | 330/257 |
| 5,198,784 | 3/1993 | Fenk | 331/117 |

FOREIGN PATENT DOCUMENTS

0412435A2  2/1991  European Pat. Off. .......... H03B 5/12

*Primary Examiner*—Nathan J. Flynn
*Attorney, Agent, or Firm*—Edward W. Goodman

[57] ABSTRACT

Tuning circuit in which a local oscillator is constituted by an amplifier which is coupled to a resonant circuit of the variable capacitance and inductance type, the amplifier having a first stage formed by at least one differential pair of bipolar transistors (T1, T2). The amplifier has also a second stage with another differential pair of transistors whose linked emitters are fed by the collector current of one (T2) of the transistors of the first stage. A transistor (T3) of the differential pair of the second stage has its collector coupled to a main load resistor (RL) and its base coupled to the collector of the other transistor (T1) of the first stage, which feeds a supplementary load resistor (Rb). The base of the other transistor (T4) of the differential pair of the second stage may be polarized at a fixed voltage (Vref2) or at a variable voltage, having the appropriate.

11 Claims, 4 Drawing Sheets

TUNING CIRCUIT FOR A RECEIVER, PARTICULARLY A TELEVISION RECEIVER

BACKGROUND OF THE INVENTION

1. Field of the Invention

The invention relates to a tuning circuit for a receiver, in which a local oscillator, having a voltage-controlled frequency, is constituted by an amplifier which is coupled to a resonant circuit of the variable capacitance and inductance type, an output terminal of the amplifier being positively fed back to an input of the amplifier and to a terminal of the resonant circuit, in which circuit the amplifier has a first stage formed by a differential pair of bipolar transistors whose linked emitters are connected to a current source, which pair is formed by a first transistor whose base is connected to an input terminal of the amplifier and a second transistor whose collector is coupled to a main load resistor having one end connected to a power supply terminal and the other end connected to an output terminal of the amplifier.

The invention also relates to an integrated circuit for a receiver comprising elements of the tuning circuit mentioned above, as well as to a television receiver in which such a tuning circuit is used.

2. Description of the Related Art

A tuning circuit of the type mentioned above is present in practically all radio or television receivers in which it is used for user selection of one of the available channels. In this tuning circuit, the local oscillator plays a very important role for producing an intermediate frequency signal by means of a frequency difference between the signal to be received and the signal of this local oscillator. Particularly in television receivers, it is often difficult to obtain an oscillator which is capable of functioning in a wide range of high frequencies.

As is known, the local oscillator of a receiver is constituted by an amplifier device coupled to a resonant circuit most frequently constituted by a capacitance-inductance combination. It is nowadays preferred to construct this amplifier from a differential pair of transistors instead of using a single transistor. Better performances are obtained particularly as regards the absence of even harmonics in the signal produced by the local oscillator, and due to the fact that the input impedance of the amplifier, which remains high for the greater part of a period of the output signal, is thus high on average.

An oscillator activated by means of a differential pair of transistors is known from the document EP-A-0 412, corresponding to U.S. Pat. No. 5,034,706, in which a resonant circuit of the LC type is indicated.

When it is attempted to extend the range of frequencies covered by an LC resonant circuit oscillator in which the variable element is a variable capacity diode as a function of a control voltage, it will be experienced that there is a considerable limitation at the lowest frequencies where the oscillator ceases to function. This phenomenon is related to a resonant circuit coefficient of insufficient quality, which is due to high losses in the variable capacity diode.

As the variable capacitor C is arranged in parallel with an inductance L, the equivalent parallel loss resistance Rp of this capacitor may be evaluated by means of a simple computation based on the series loss resistance $R_s$ resulting in:

$$Rp = L/(R_s \cdot C)$$

It will be noted that the parallel loss resistance Rp decreases when $R_s$ and/or C increase and that an oscillation is thus difficult at the low frequencies in the wanted range, under which circumstances, the capacitor has a high value.

A first approach to solving this difficulty may be the use of several series-parallel diodes for obtaining a variable capacitance of a better quality.

However, this solution is hardly satisfactory because the losses are only reduced to a small extent as a function of the number of diodes used, which solution would be costly and cumbersome if a very large number of diodes had to be used.

A second approach which is frequently used is to arrange a fixed capacitance (substantially free from losses) in series with the variable capacitor, which fixed capacitance is known as a "padder". In accordance with this solution, the losses are effectively reduced but the bandwidth of the frequencies covered is also reduced, which is contrary to the envisaged object.

SUMMARY OF THE INVENTION

A solution to the problem posed by a tuning circuit which has to operate in an extensive range of frequencies might be obtained by increasing the gain of the amplifier activating the local oscillator so that it would be capable of presenting a sufficiently low negative resistance at the output for compensating the high losses of the resonant circuit at the low frequencies.

One of the objects of the present invention is therefore to provide a tuning circuit in which the local oscillator is provided with an amplifier having a high gain and cut-off frequency. Another object of the invention is to provide an oscillator using an LC resonant circuit with which the range of variations of the oscillation frequency is extended towards the low frequencies due to the fact that the amplifier compensates the losses more efficiently.

According to the invention, a tuning circuit as described in the opening paragraph is characterized in that the amplifier has also a second stage comprising a differential pair of transistors formed by a third and a fourth transistor whose linked emitters are connected to the collector of the second transistor, and in that the main load resistor is connected to the collector of the third transistor whose base is connected to one end of a supplementary load resistor which is coupled to the collector of the first transistor, while the base of the fourth transistor is connected to a reference voltage.

The collector current of the second transistor, which contains the signal amplified by the first stage, thus feeds the differential pair of the second stage in which the third transistor amplifies this signal again by means of a control of its base from the first stage, which control has the suitable phase.

In accordance with this first embodiment, the amplifier supplies an asymmetrical signal at the output terminal. To function in the asymmetrical mode at the input, the base of the second transistor may be connected to a fixed DC source. However, the amplifier may also receive a differential signal at its two input terminals.

In accordance with a variant of this embodiment, the main current path of a cascode transistor is arranged between the collector of the first transistor and the supplementary load resistor. Such a cascode stage has for its object to increase the cut-off frequency of the amplifier notably by reducing the influence of parasitic capacitances.

It may be useful to progressively reduce the amplifier gain when the frequency increases because the considerable losses of the resonant circuit only occur at the lowest frequencies. It may thus be advantageous to ensure that the supplementary load resistor is connected parallel to a capacitor. The voltage of the base of the third transistor thus receives a signal which is reduced with respect to the highest frequencies. In other cases, the parasitic capacitances of the used transistors realize this reduction without the necessity of adding a supplementary capacitance.

Another embodiment of the invention relates to a tuning circuit for a receiver, in which a local oscillator comprises an amplifier which may function symmetrically. In accordance with this second embodiment, the tuning circuit includes a local oscillator having a voltage-controlled frequency, and is constituted by an amplifier which is coupled to a resonant circuit of the variable capacitance and inductance type, an output terminal of the amplifier being positively fed back to an input of the amplifier and to a terminal of the resonant circuit, in which circuit the amplifier has a first stage formed by at least a first differential pair of bipolar transistors whose combined emitters are fed by a first current source, which pair is constituted by a first transistor whose base is connected to a first input terminal and a second transistor whose base is connected to a second input terminal and whose collector is coupled to a first main load resistor which has one end connected to a power supply terminal and the other end connected to a first output terminal of the amplifier, while symmetrically, the collector of the first transistor is coupled to a second main load resistor which is connected to a second output terminal of the amplifier, which circuit is characterized in that the first stage of the amplifier has also a second differential pair of transistors whose linked emitters are connected to a second current source, said second pair being constituted, on the one hand, by a transistor which is homologue to the first transistor and has its base connected to the base of the first transistor and its collector coupled to a first supplementary load resistor, and, on the other hand by a transistor which is homologue to the second transistor and has its base connected to the base of the second transistor and its collector coupled to a second supplementary load resistor, and in that the amplifier has also a second stage formed by two differential pairs of transistors:

one pair of transistors whose linked emitters are connected to the collector of the second transistor, in which pair one of the transistors has its collector connected to the first main load resistor and its base connected to the first supplementary load resistor, and the other transistor has its base connected to the second supplementary load resistor, and another differential pair of transistors controlled symmetrically with respect to the previous pair, whose linked emitters are connected to the collector of the first transistor, in which pair one of the transistors has its collector connected to the second main load resistor and its base connected to the second supplementary load resistor, and the other transistor has its base connected to the first supplementary load resistor.

As compared with the first embodiment of the invention, the second stage of the amplifier now has two pairs of transistors instead of one, while the first stage comprises a supplementary differential pair of transistors coupled to the first pair and used for the purpose of providing the currents in the two supplementary load resistors.

In an advantageous variant of this embodiment, the circuit is characterized in that in the second stage of the amplifier said other transistor whose base is connected to the first supplementary load resistor has its collector connected to the first main load resistor, and symmetrically, said other transistor whose base is connected to the second supplementary load resistor has its collector connected to the second main load resistor.

The gain of this amplifier is thus brought to its maximum value because the collector currents of the four transistors of the second stage are all coupled to one of the two load resistors as a function of the phase of the signals produced by these transistors.

The invention also relates to an integrated circuit for a receiver, notably a television receiver in which the circuit described hereinbefore is at least partially incorporated.

These and other aspects of the invention will be apparent from and elucidated with reference to the embodiments described hereinafter.

DESCRIPTION OF THE PREFERRED EMBODIMENTS

Figure 1:
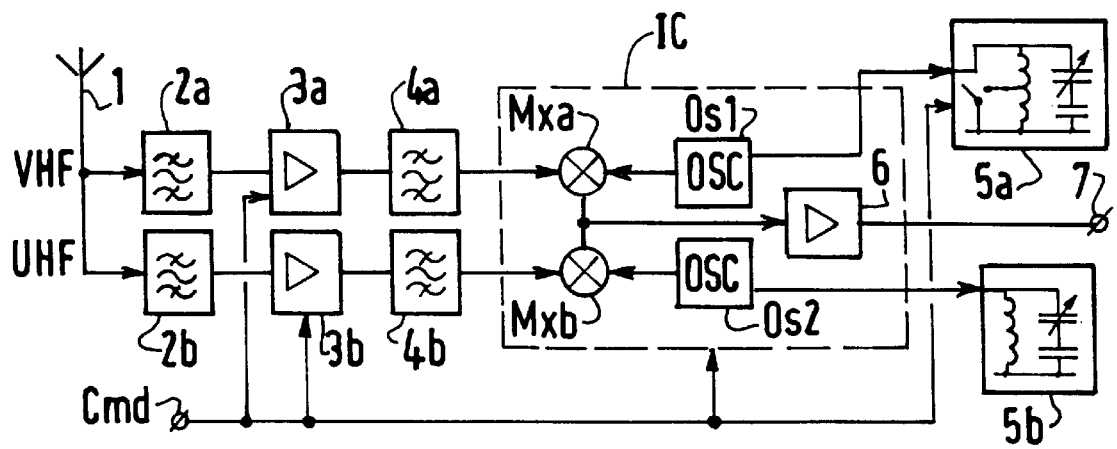
FIG. 1 is a functional diagram indicating the constituent parts of a tuning circuit for a television receiver.

FIG. 1 shows, very diagrammatically a tuning circuit for a television receiver. It is generally divided into two sections having a similar composition, one section processing the signals of the VHF band, and one section processing those of the UHF band. The signals received at an antenna 1 are first treated by input filters 2a and 2b and then amplified by preamplifiers 3a, 3b and filtered again in band-separating filters 4a and 4b. The respective signals of the VHF and UHF bands are subsequently each presented to one of the inputs of two mixers Mxa and Mxb.

The other input of said mixers receives the signal from a local oscillator Os1 for mixer Mxa and from a local oscillator Os2 for mixer Mxb. More particularly, the references Os1 and Os2 denote the active parts of the oscillators (amplifiers) associated with resonant circuits shown diagrammatically and denoted by 5a and 5b, of the variable capacitance and inductance type. By way of example, the resonant circuit 5a of the local oscillator Os1 corresponding to the VHF band may be provided with an inductance switch for dividing the frequency interval into two sub-bands.

The outputs of the two mixers Mxa and Mxb are combined and connected to the input of an IF preamplifier 6 whose output 7 also constitutes the output of the tuning circuit.

In a preferred embodiment, the mixers Mxa, Mxb, the active parts Os1 and Os2 of the oscillators, and the preamplifier 6 are regrouped within the same integrated circuit which is symbolized in FIG. 1 by the box in broken lines denoted by IC.

A switch control between the VHF and UHF frequency ranges is shown in FIG. 1 by means of connections from a terminal Cmd. Such a control need not be described in detail because it is well known to those skilled in the art and does not directly relate to the inventive means.

An amplifier will now be described with reference to FIG. 2, which amplifier constitutes the active part of one of the oscillators Os1 or Os2 of FIG. 1 in accordance with a first embodiment which, in a very simplified form, may be considered as a basic mode of the inventive principle. The amplifier has a first stage constituted by a differential pair of bipolar transistors T1, T2 of the NPN type. The linked emitters of these transistors are connected to a current source So supplying a current Io. The base of the transistor T1 is connected to an input terminal 10 of the amplifier, while the base of the second transistor T2 is connected to a DC source Vref1. This source is determined by the voltage drop provided by two resistors 12, 14 in series, through which a current I1 flows which is supplied by a current source S1, between a power supply voltage Vcc and ground Vee. The DC voltage Vref1 is decoupled with respect to ground by a capacitor 16 which may have a low value if the amplifier is to operate at a very high frequency, for example, 400 MHz. The collector of the second transistor T2 is connected to the linked emitters of a second differential pair of transistors constituted by NPN transistors T3 and T4, in which a differential pair, the transistor T3 has its collector coupled to the power supply voltage Vcc via a load resistor RL, hereinafter referred to as main load resistor. The fourth transistor T4 has its collector connected directly to the power supply voltage Vcc. The junction point between the collector of the transistor T3 and the main load resistor RL is connected to an output terminal 30 of the amplifier. The collector current of the second transistor T2 having an AC component already amplified by the first stage T1–T2 is amplified again by the differential pair T3–T4 because the base of the third transistor T3 receives a voltage signal having the suitable phase, originating from a supplementary load resistor Rb connected to the collector of the first transistor T1. The other end of this supplementary load resistor Rb is connected to the power supply voltage Vcc.

The base of the fourth transistor T4 is connected to a reference voltage source Vref2 between the resistors 12 and 14.

This amplifier operates optimally when the pair of transistors T3, T4 functions as a balanced pair from a DC point of view, i.e., if, in the example of FIG. 1, the resistor 12 has a value equal to that of the supplementary load resistor Rb, the current I1 supplied by the current source S1 is then chosen to be equal to half the current I0 supplied by the current source So. The bases of the transistors T3 and T4 are thus polarized at a very close DC voltage. The same result may alternatively be obtained by other suitable choices of the values of current I1 and resistor 12.

As will be evident hereinafter, in connection with the use of this amplifier in a wideband oscillator, it may be useful to progressively reduce the gain of the amplifier when the frequency of the AC signal increases. This may be realized in a very simple manner by reducing the amplification of the second stage of transistors T3, T4 by decreasing the AC signal applied to the base of the transistor T3, which signal is furnished by the supplementary load resistor Rb. This decrease is obtained by coupling a low value capacitor Cp in parallel with this resistor, which possibility is shown in the Figure by means of a broken-line connection. It is thus apparent that the assembly formed by the supplementary load resistor Rb and the parallel capacitor Cp constitutes a complex load with which the gain of this amplifier can be controlled to a certain extent as a function of its frequency.

Practice has proven that the parasitic capacitances of the third transistor T3 may provide the same effect as the parallel capacitor Cp in that the choice of the size of transistor T3 and its implementation provides the possibility of controlling the response curve of the amplifier.

It will be preferable to choose, as a fourth transistor T4, a transistor of the same construction as the transistor T3 so that a balanced differential pair of transistors can be formed.

Figure 2:
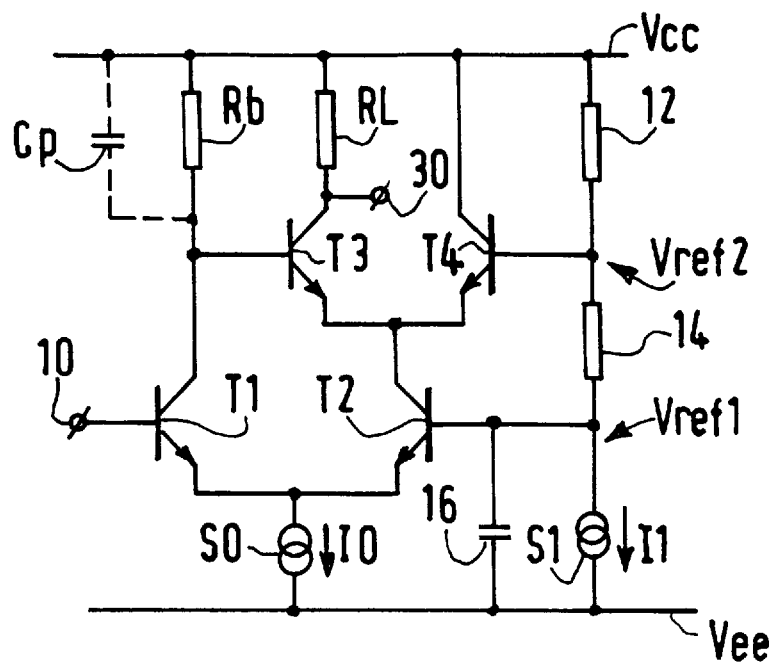
FIG. 2 is the electric circuit diagram of an amplifier forming part of a local oscillator modified in accordance with the invention in a simple embodiment.
Figure 3:
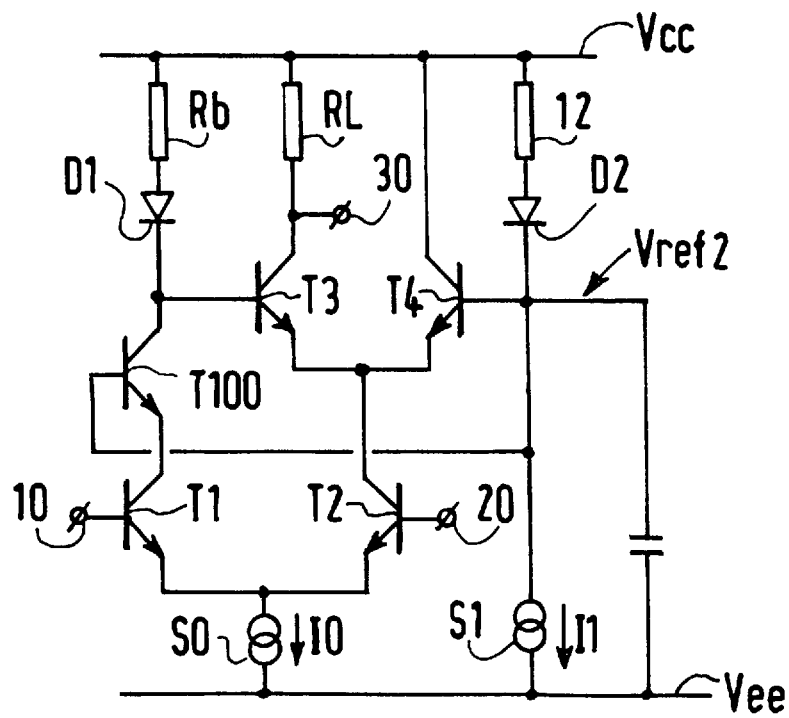
FIG. 3 is the electric circuit diagram of a variant of the amplifier of FIG. 2.

FIG. 3 shows a variant of the embodiment of the amplifier of FIG. 2.

In the diagram of FIG. 3, the elements having the same function are denoted by the same reference signs. With regard to the first stage constituted by the pair of transistors T1, T2, FIG. 3 shows the case of an amplifier having differential inputs because the base of the transistor T2 is connected to a second input terminal 20, which is in contrast to the amplifier of FIG. 2 in which the base of the transistor T2 is connected to a reference voltage.

Another difference concerning the amplifier of FIG. 3 is the insertion of the diodes D1 and D2 which lowers the base bias of the transistors T3 and T4 by a forward junction drop. In this way, the output voltage supplied from the output terminal 30 of the amplifier may allow a higher voltage swing.

The most important variant of the diagram of FIG. 3 is constituted by the interposition of a cascode transistor T100 between the collector of transistor T1 and the base of transistor T3, which cascode transistor has its base connected to a fixed voltage, for example, the voltage Vref2 already used for polarizing the base of transistor T4. The presence of the cascode transistor T100 improves the performance of the amplifier at the highest frequencies.

Although the circuit of FIG. 3 may be fed by a symmetrical signal because of its two inputs 10 and 20, the amplifier shown has only one output 30 and is thus asymmetrical from this point of view.

It should be noted that the choice of a given input construction for the first stage of the amplifier, that is for an asymmetrical, differential or symmetrical mode is independent of other particularities of the circuits shown in FIGS. 2 and 3.

Examples of amplifiers for use in a tuning circuit according to the invention will now be described, which amplifiers may function in a completely symmetrical manner and thus have two inputs and two outputs.

Figure 4:
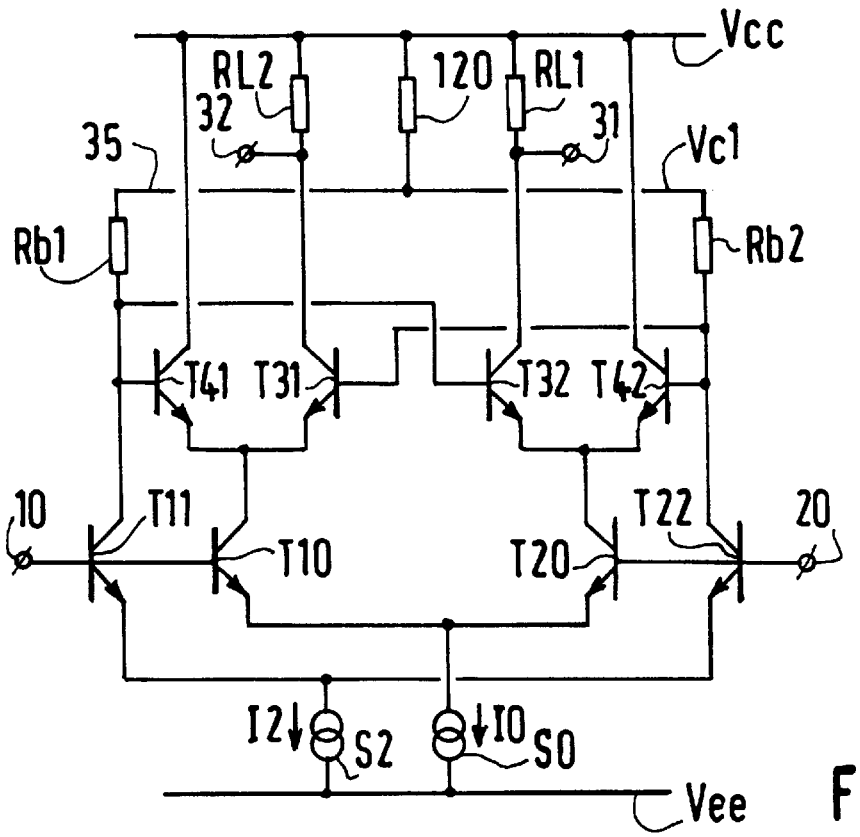
FIG. 4 is an electric circuit diagram of the amplifier forming part of the circuit according to the invention in accordance with a second embodiment, enabling a symmetrical operation.

FIG. 4 shows the circuit diagram of a first example of such a symmetrical amplifier. A first stage comprises a first differential pair of transistors T10, T20 whose bases are connected to the input terminals 10 and 20, respectively. The linked emitters of the transistors T10 and T20 are fed by a current source So supplying a current Io.

In the first stage, the amplifier has a second differential pair of transistors T11, T22 whose bases are connected to the bases of the transistors T10 and T20 and to the input terminals 10 and 20, respectively. The linked emitters of this second differential pair of transistors are connected to a second current source S2 supplying a current I2. The differential pair of transistors T11 and T12 is used for supplying voltage-amplified signals to the bases of the transistors of the second stage. This is realized by coupling the collector of the transistor T11 to a first supplementary load resistor Rb1 and by coupling the collector of the transistor T22 to a second supplementary load resistor Rb2. These two resistors are also connected to a line 35 conveying a power supply voltage Vc1, of a value between Vcc and Vee. This voltage Vc1 may be simply obtained from the power supply voltage Vcc after a voltage drop in a resistor 120. The voltage drop thus created is related to the effect of the diodes D1 and D2 of the amplifier of FIG. 3 and provides a comparable effect.

Another particularity of this embodiment is constituted by the second amplifier stage which comprises two differential pairs of transistors instead of one, namely: a pair of transistors T32, T42 whose linked emitters are connected to the collector of transistor T20, which pair plays a role analogous to that of transistors T3 and T4 in the previous examples. However, the base of transistor T42 is not connected to a reference voltage source but to a variable voltage as a function of the input voltage because it is connected to the supplementary load resistor Rb2. It thus represents a base voltage in phase opposition with the base voltage of transistor T32 which is connected to the supplementary load resistor Rb1. The collector of the transistor T42 is connected to the voltage Vcc.

The pair of transistors T32, T42 is thus more active than its equivalent in the previous examples constituted by transistors T3 and T4, because the bases of this pair of transistors are activated in a symmetrical manner. The collector of the transistor T32 is coupled to a first main load resistor RL1 which is connected to the power supply voltage Vcc. The junction point between the collector of this transistor and the resistor RL1 is connected to a first output terminal 31 of the amplifier.

A completely symmetrical arrangement is realised by another differential pair of transistors T31, T41 whose linked emitters are connected to the collector of transistor T10. The transistor T31, which is symmetrical to the transistor T32, has its base connected to the supplementary load resistor Rb2 and its collector coupled to a second main load resistor RL2. The other end of this resistor is connected to the power supply voltage Vcc. The junction point between the collector of the transistor T31 and the resistor RL2 is also connected to a second output terminal 32 of the amplifier.

The transistor T41, which is symmetrical to the transistor T42, has its base connected to the supplementary load resistor Rb1 and its collector connected to the voltage Vcc. The input terminals 10 and 20 of the amplifier of FIG. 4 may receive a symmetrical input signal or an asymmetrical input signal when one of the two terminals is polarized at a fixed reference voltage. In contrast, because of their balanced arrangement, the output terminals 31 and 32 convey an output voltage which is symmetrical in all cases.

Figure 5:
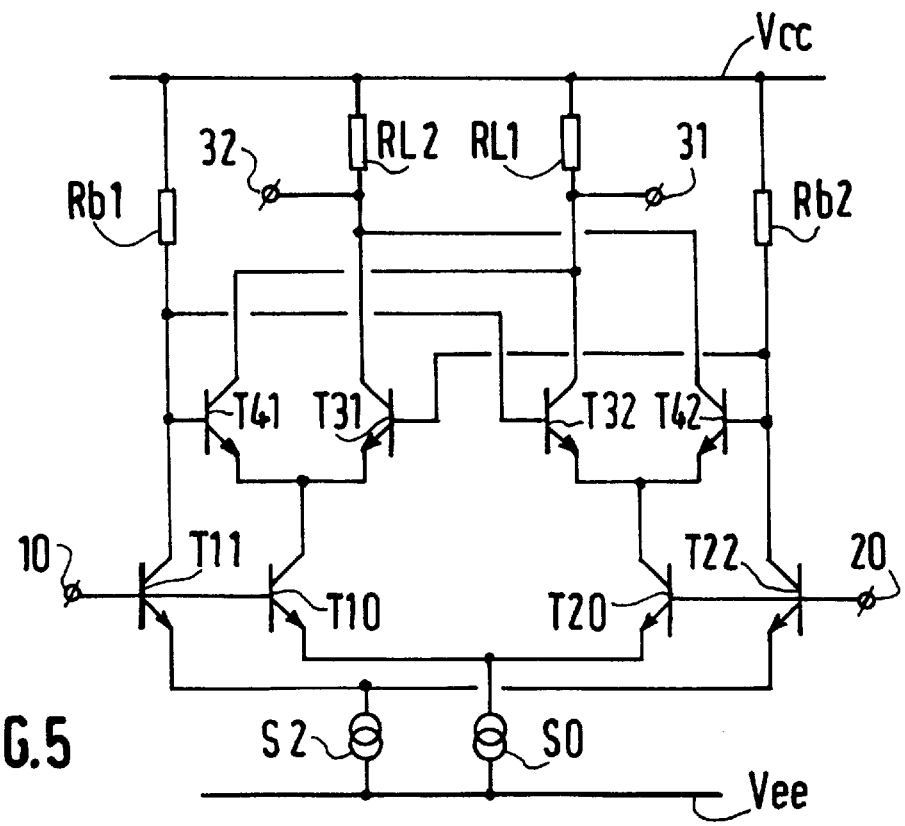
FIG. 5 is the circuit diagram of a variant of the amplifier of FIG. 4.

A variant of the embodiment of the amplifier described with reference to FIG. 4 will now be described with reference to FIG. 5.

As far as is possible, the elements having the same function are denoted by the same reference signs.

The first stage of the amplifier, composed of the differential pair of transistors T10, T20 and the differential pair of transistors T11 and T22, is in conformity with the first stage of the amplifier of FIG. 4. The only difference is that the supplementary load resistors Rb1 and Rb2 coupled to the collectors of the transistors T11 and T22 are now directly connected to the power supply voltage Vcc. A decrease of the average DC voltage of the bases of transistors T41 and T42 may be obtained by an increase of the current supplied by the current source S2 or by an increase of the supplementary load resistors Rb1 and Rb2. An important difference with respect to the diagram of FIG. 4 is the coupling of the collectors of the transistors T41 and T42. The collector current of these transistors, which contains an amplified AC component, is coupled to the load resistors RL2 and RL1 in the manner suitable for the phase of these signals. The collector of the transistor T42 is thus connected to the load resistor RL2 while the collector of transistor T41 is connected to the load resistor RL1. In accordance with this embodiment, the maximum gain is obtained because the second stage presents no loss of amplified AC current.

In the examples described with reference to FIGS. 4 and 5, it is evident that the supplementary load resistors Rb1 and Rb2 may be coupled parallel to capacitors, as indicated in FIG. 2, so that they form load impedances which vary with the frequency.

Figure 6:
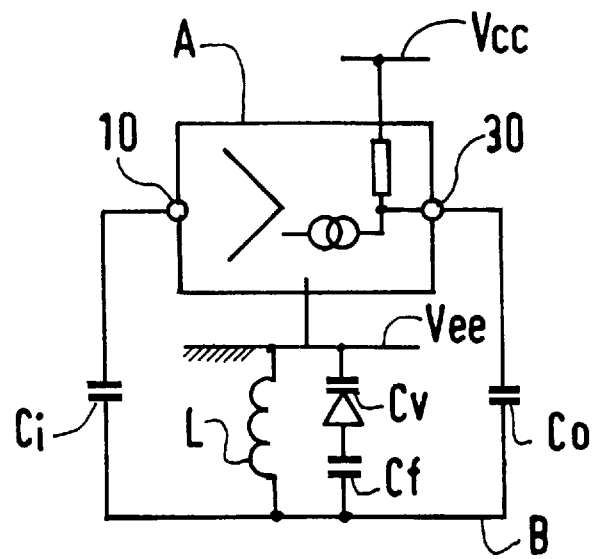
FIG. 6 is a simplified circuit diagram of an application of the amplifier described in FIGS. 2 or 3 to an oscillator operating in the asymmetrical mode.

FIG. 6 shows an example of using an amplifier of the type which is asymmetrical with respect to the embodiment of a variable frequency oscillator, using a parallel resonant circuit of the LC type.

The amplifier A has its output terminal 30 coupled to the junction point B of the resonant circuit by means of a coupling capacitor Co. The resonant circuit is constituted by a tuning inductance L connected in parallel with a series combination of capacitors, one of which is a fixed capacitor Cf and the other is a variable capacitor Cv which can be controlled by means of a control voltage. These capacitance and inductance elements are arranged in parallel between ground (Vee) and the junction point B. The junction point B is positively fed back to the input terminal 10 of the amplifier by means of a capacitor Ci. This feedback realises a negative resistance feeding the oscillating circuit L, Cv+Cf, generating the oscillation of the circuit. An extension of the range of frequencies covered by the oscillator is obtained in that, at the lowest frequencies for which the variable capacitor Cv presents considerable losses, the negative resistance produced by the amplifier A is still sufficiently low to allow the oscillator to function. To allow this extension of the range of frequencies, the fixed capacitor Cf is chosen to have a sufficiently high value.

Figure 7:
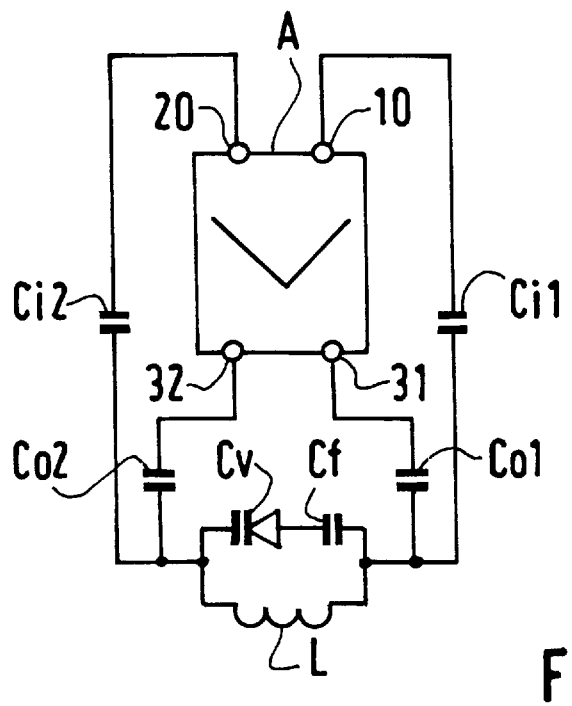
FIG. 7 is the circuit diagram of an oscillator operating in the symmetrical mode incorporating an amplifier of the type described in FIG. 4 or 5.

Another example of an oscillator now using an amplifier having a symmetrical structure similarly as one of those presented in the examples of FIGS. 4 and 5 will now be described with reference to FIG. 7.

The LC resonant circuit is the same as in the previous example but is fed in a symmetrical manner. The amplifier A has a first output 31 coupled to the resonant circuit by means of a coupling capacitor Co1 as well as to the input 10 of the amplifier by means of a coupling capacitor Ci1. In a symmetrical manner, the second output 32 of the amplifier is coupled to the other end of the resonant circuit by means of a coupling capacitor Co2 and is also coupled to the second input 20 of the amplifier by means of a coupling capacitor Ci2. The oscillator of FIG. 7 has the same advantages as the oscillator of FIG. 6, that is, a possibility of extending the range of frequencies covered. It also benefits from a higher common mode rejection.

Figure 8:
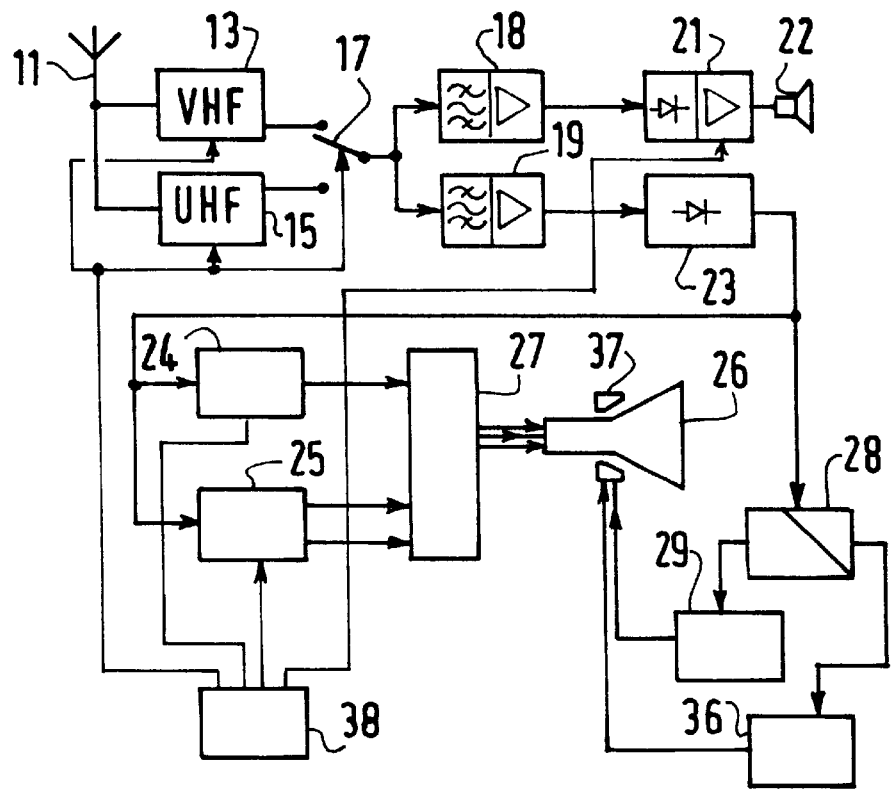
FIG. 8 is a functional circuit diagram indicating the constituent parts of a television receiver in which the circuit according to the invention can be incorporated.

FIG. 8 shows a simplified circuit diagram of a television receiver in which the tuning circuit described above may be incorporated. The reception signals received by an antenna 11 are applied to the input of a channel selector composed of two modules: a selection module 13 for the VHF band which may be split up into two sub-bands and a module 15 for the selection of the UHF band. The signal corresponding to a channel selected by a switch 17 in one or the other of these frequency bands is applied in parallel to the input of a module 18 for filtering and preamplifying the audio signal as well as to a module 19 for filtering and preamplifying the video signal. The audio signal is demodulated and then power amplified in a module 21 whose output is connected to a loudspeaker 22.

The preamplified video signal from the module 19 is applied to the input of a demodulator 23 from which it is subsequently applied to different sections of the receiver. One section composed of a module 24 for processing the luminance signal and a module 25 for processing the chrominance signal provides appropriate signals for three guns of a picture display tube 26 via a matrix circuit 27 for restoring the three color signals and amplifying these signals. Another section of the receiver is intended to realize the function of scanning the screen of the tube 26 and is essentially composed of a sync separating circuit 28 supplying appropriate signals to a line scanning generator 29 and a field scanning generator 36 whose outputs are connected to a set of deflection coils 37.

A control module 38 regroups the various control and selection means which supply appropriate control signals for a majority of parts of the functional modules of the receiver, as has been shown diagrammatically in the Figure.

A television receiver as briefly described hereinbefore is advantageously provided with at least one tuning circuit with a bandwidth which is extended by means of the invention, which circuit may be formed as an integrated circuit as described with reference to FIG. 1 and as denoted in this Figure by the reference IC.

I claim:

1. A tuning circuit for a receiver, said tuning circuit comprising a local oscillator having a voltage-controlled frequency, said local oscillator comprising an amplifier coupled to a resonant circuit having variable capacitance and inductance, an output terminal of the amplifier being positively fed back to an input of the amplifier and to a terminal of the resonant circuit, the amplifier comprising a first stage having a first differential pair of bipolar transistors having linked emitters connected to a current source, said first differential pair of bipolar transistors comprising a first transistor having a base connected to an input terminal of the amplifier, and a second transistor having a collector coupled to a main load resistor, said main load resistor having one end connected to a power supply terminal and another end connected to an output terminal of the amplifier, characterized in that the amplifier further comprises a second stage having a second differential pair of transistors comprising a third transistor and a fourth transistor, said third and fourth transistors having linked emitters connected to the collector of the second transistor, and in that the main load resistor is connected to a collector of the third transistor, the third transistor having a base connected to one end of a supplementary load resistor, said supplementary load resistor being coupled to a collector of the first transistor, while a base of the fourth transistor is connected to a reference voltage.

2. A tuning circuit as claimed in claim 1, characterized in that the base of the second transistor is connected to a fixed DC source.

3. A tuning circuit as claimed in claim 1, characterized in that a main current path of a cascode transistor is arranged between the collector of the first transistor and the supplementary load resistor.

4. A tuning circuit as claimed in claim 1, characterized in that a capacitor is connected parallel to the supplementary load resistor.

5. A tuning circuit for a receiver, said tuning circuit comprising a local oscillator having a voltage-controlled frequency, said local oscillator comprising an amplifier coupled to a resonant circuit having variable capacitance and inductance, an output terminal of the amplifier being positively fed back to an input of the amplifier and to a terminal of the resonant circuit, the amplifier comprising a first stage having at least a first differential pair of bipolar transistors having linked emitters fed by a first current source, said first differential pair of bipolar transistors comprising a first transistor having a base connected to a first input terminal of the amplifier, and a second transistor having a base connected to a second input terminal of the amplifier, said second transistor having a collector coupled to a first main load resistor, said first main load resistor having one end connected to a power supply terminal and another end connected to a first output terminal of the amplifier, while symmetrically, a collector of the first transistor is coupled to a second main load resistor, said second main load resistor being connected to a second output terminal of the amplifier, characterized in that the first stage of the amplifier further comprises a second differential pair of transistors having linked emitter connected to a second current source, said second differential pair of transistors comprising a further first transistor homologous to the first transistor and having a base connected to the base of the first transistor and a collector coupled to a first supplementary load resistor, and a further second transistor homologous to the second transistor and having a base connected to the base of the second transistor and a collector coupled to a second supplementary load resistor, and in that the amplifier further comprises a second stage having two differential pairs of transistors, said two differential pairs of transistors comprising:

a third differential pair of transistors having linked emitters connected to the collector of the second transistor, wherein a third transistor of the third differential pair of transistors has a collector connected to the first main load resistor and a base connected to the first supplementary load resistor, and a fourth transistor of said third differential pair of transistors has a base connected to the second supplementary load resistor; and a fourth differential pair of transistors controlled symmetrically with respect to the third differential pair of transistors, said fourth differential pair of transistors having linked emitters connected to the collector of the first transistor, said fourth differential pair of transistors comprising a fifth transistor having a collector connected to the second main load resistor and a base connected to the second supplementary load resistor, and a sixth transistor having a base connected to the first supplementary load resistor.

6. A tuning circuit as claimed in claim 5, characterized in that the first and second supplementary load resistors are coupled to an intermediate power supply terminal.

7. A tuning circuit as claimed in claim 5, characterized in that in the second stage of the amplifier, said sixth transistor further includes a collector connected to the first main load resistor, and symmetrically, said fourth transistor further includes a collector connected to the second main load resistor.

8. A tuning circuit as claimed in claim 5, characterized in that a respective capacitor is connected parallel to each supplementary load resistor.

9. An integrated circuit for a receiver, said integrated circuit comprising an amplifier contained in a tuning circuit, a mixer circuit and an intermediate frequency preamplifier, wherein said tuning circuit comprises a local oscillator having a voltage-controlled frequency, said local oscillator comprising said amplifier coupled to a resonant circuit having variable capacitance and inductance, an output terminal of the amplifier being positively fed back to an input of the amplifier and to a terminal of the resonant circuit, the amplifier comprising a first stage having a first differential pair of bipolar transistors having linked emitters connected to a current source, said first differential pair of bipolar transistors comprising a first transistor having a base connected to an input terminal of the amplifier, and a second transistor having a collector coupled to a main load resistor, said main load resistor having one end connected to a power supply terminal and another end connected to an output terminal of the amplifier, characterized in that the amplifier further comprises a second stage having a second differential pair of transistors comprising a third transistor and a fourth transistor, said third and fourth transistors having linked emitters connected to the collector of the second transistor, and in that the main load resistor is connected to a collector of the third transistor, the third transistor having a base connected to one end of a supplementary load resistor, said supplementary load resistor being coupled to a collector of the first transistor, while a base of the fourth transistor is connected to a reference voltage.

10. A television receiver, characterized in that said television receiver includes a tuning circuit, wherein said tuning circuit comprises a local oscillator having a voltage-controlled frequency, said local oscillator comprising an amplifier coupled to a resonant circuit having variable capacitance and inductance, an output terminal of the amplifier being positively fed back to an input of the amplifier and to a terminal of the resonant circuit, the amplifier comprising a first stage having a first differential pair of bipolar transistors having linked emitters connected to a current source, said first differential pair of bipolar transistors comprising a first transistor having a base connected to an input terminal of the amplifier, and a second transistor having a collector coupled to a main load resistor, said main load resistor having one end connected to a power supply terminal and another end connected to an output terminal of the amplifier, characterized in that the amplifier further comprises a second stage having a second differential pair of transistors comprising a third transistor and a fourth transistor, said third and fourth transistors having linked emitters connected to the collector of the second transistor, and in that the main load resistor is connected to a collector of the third transistor, the third transistor having a base connected to one end of a supplementary load resistor, said supplementary load resistor being coupled to a collector of the first transistor, while a base of the fourth transistor is connected to a reference voltage.

11. A television receiver, characterized in that it includes an integrated circuit as claimed in claim 9.

* * * * *